United States Patent
Kitada (10) Patent No.: US 11,938,730 B2
(45) Date of Patent: Mar. 26, 2024

(54) PIEZOELECTRIC ELEMENT, LIQUID EJECTING HEAD, AND LIQUID EJECTING APPARATUS

(71) Applicant: SEIKO EPSON CORPORATION, Tokyo (JP)

(72) Inventor: Kazuya Kitada, Matsumoto (JP)

(73) Assignee: Seiko Epson Corporation, Tokyo (JP)

(*) Notice: Subject to any disclaimer, the term of this patent is extended or adjusted under 35 U.S.C. 154(b) by 45 days.

(21) Appl. No.: 17/448,920

(22) Filed: Sep. 27, 2021

(65) Prior Publication Data

US 2022/0097372 A1 Mar. 31, 2022

(30) Foreign Application Priority Data

Sep. 29, 2020 (JP) ................ 2020-163462

(51) Int. Cl.
- *B41J 2/14* (2006.01)
- *H10N 30/00* (2023.01)
- *H10N 30/078* (2023.01)

(52) U.S. Cl.
CPC .... *B41J 2/14233* (2013.01); *H10N 30/10516* (2023.02); *B41J 2002/14258* (2013.01); *H10N 30/078* (2023.02)

(58) Field of Classification Search
None
See application file for complete search history.

(56) References Cited

U.S. PATENT DOCUMENTS

| | | | | |
|---|---|---|---|---|
| 2009/0236947 A1* | 9/2009 | Comyn | ................ | C01G 49/009 252/62.9 PZ |
| 2012/0145943 A1* | 6/2012 | Tan | ................... | C04B 35/6262 252/62.9 PZ |
| 2015/0280103 A1* | 10/2015 | Kobayashi | ........... | B41J 2/14201 347/68 |
| 2016/0111628 A1* | 4/2016 | Yonemura | ........... | H01L 41/0477 29/25.35 |
| 2018/0175277 A1* | 6/2018 | Kitada | ............... | B41J 2/14201 |

FOREIGN PATENT DOCUMENTS

JP 2004-66600 A 3/2004

* cited by examiner

*Primary Examiner* — Erica S Lin
(74) *Attorney, Agent, or Firm* — WORKMAN NYDEGGER (57) ABSTRACT

Provided is a piezoelectric element in which a first electrode, a seed layer, a piezoelectric layer, and a second electrode are laminated on a substrate, in which the seed layer is a composite oxide containing at least Pb, Bi, Fe, and Ti.

20 Claims, 11 Drawing Sheets

SEED LAYER: $Pb_xBi_{(a-x)}Fe_yTi_{(b-y)}O_z$
$a=1.2$ $b=1.0$ $y=0.5$

| SAMPLE | LOWER LAYER | SEED LAYER | | |
|---|---|---|---|---|
| | | x | x/a | x/(a-x) |
| COMPARATIVE EXAMPLE | Pt/ZrO₂ | 0.0 | 0.000 | 0.000 |
| EXAMPLE (1) | Pt/ZrO₂ | 0.05 | 0.042 | 0.043 |
| EXAMPLE (2) | Pt/ZrO₂ | 0.1 | 0.083 | 0.091 |
| EXAMPLE (3) | Pt/ZrO₂ | 0.2 | 0.167 | 0.200 |
| EXAMPLE (4) | Pt/ZrO₂ | 0.3 | 0.250 | 0.333 |
| EXAMPLE (5) | Pt/ZrO₂ | 0.5 | 0.417 | 0.714 |
| EXAMPLE (6) | Pt/ZrO₂ | 0.7 | 0.583 | 1.400 |
| EXAMPLE (7) | Pt/ZrO₂ | 0.9 | 0.750 | 3.000 |
| EXAMPLE (8) | Ir | 0.1 | 0.083 | 0.091 |

SEED LAYER: $Pb_x Bi_{(a-x)} Fe_y Ti_{(b-y)} O_z$
$a=1.2 \quad b=1.0 \quad y=0.5$

| SAMPLE | LOWER LAYER | SEED LAYER | | |
|---|---|---|---|---|
| | | x | x/a | x/(a-x) |
| COMPARATIVE EXAMPLE | Pt/ZrO$_2$ | 0.0 | 0.000 | 0.000 |
| EXAMPLE (1) | Pt/ZrO$_2$ | 0.05 | 0.042 | 0.043 |
| EXAMPLE (2) | Pt/ZrO$_2$ | 0.1 | 0.083 | 0.091 |
| EXAMPLE (3) | Pt/ZrO$_2$ | 0.2 | 0.167 | 0.200 |
| EXAMPLE (4) | Pt/ZrO$_2$ | 0.3 | 0.250 | 0.333 |
| EXAMPLE (5) | Pt/ZrO$_2$ | 0.5 | 0.417 | 0.714 |
| EXAMPLE (6) | Pt/ZrO$_2$ | 0.7 | 0.583 | 1.400 |
| EXAMPLE (7) | Pt/ZrO$_2$ | 0.9 | 0.750 | 3.000 |
| EXAMPLE (8) | Ir | 0.1 | 0.083 | 0.091 |

PIEZOELECTRIC ELEMENT, LIQUID EJECTING HEAD, AND LIQUID EJECTING APPARATUS

The present application is based on, and claims priority from JP Application Serial Number 2020-163462, filed Sep. 29, 2020, the disclosure of which is hereby incorporated by reference herein in its entirety.

BACKGROUND

1. Technical Field

The present disclosure relates to a piezoelectric element, a liquid ejecting head, and a liquid ejecting apparatus.

2. Related Art

In general, a piezoelectric element has a structure in which a lower electrode layer, a piezoelectric layer, and an upper electrode layer are laminated in this order on a substrate. For example, it is known that when the piezoelectric layer is made of lead zirconate titanate (hereinafter, referred to as PZT) with a rhombohedral structure, and if the PZT layer is oriented in a (100) plane, piezoelectric characteristics are improved. Thus, a method for orienting the PZT layer in the (100) plane has been proposed (JP-A-2004-66600, for example). JP-A-2004-66600 discloses a structure in which an orientation control layer made of lanthanum nickelate is included under the PZT layer.

However, there is a concern that lanthanum or nickel inside the orientation control layer is diffused in the piezoelectric layer in a process such as heat treatment at the time of fabrication and the piezoelectric characteristics are degraded in the piezoelectric element described in JP-A-2004-66600.

SUMMARY

The present disclosure can be realized in the following aspects. According to an aspect of the present disclosure, there is provided a piezoelectric element. The piezoelectric element is a piezoelectric element in which a first electrode, a seed layer, a piezoelectric layer, a second electrode are laminated on a substrate, and the seed layer is a composite oxide containing at least Pb, Bi, Fe, and Ti.

Also, according to an aspect of the present disclosure, there is provided a liquid ejecting head. The liquid ejecting head includes the piezoelectric element and a drive circuit that drives the piezoelectric element.

Also, according to an aspect of the present disclosure, there is provided a liquid ejecting apparatus including the liquid ejecting head and a control section that controls an operation of the liquid ejecting head.

DESCRIPTION OF EXEMPLARY EMBODIMENTS

A. Embodiment

A1. Overall Configuration of Liquid Ejecting Apparatus

Figure 1:
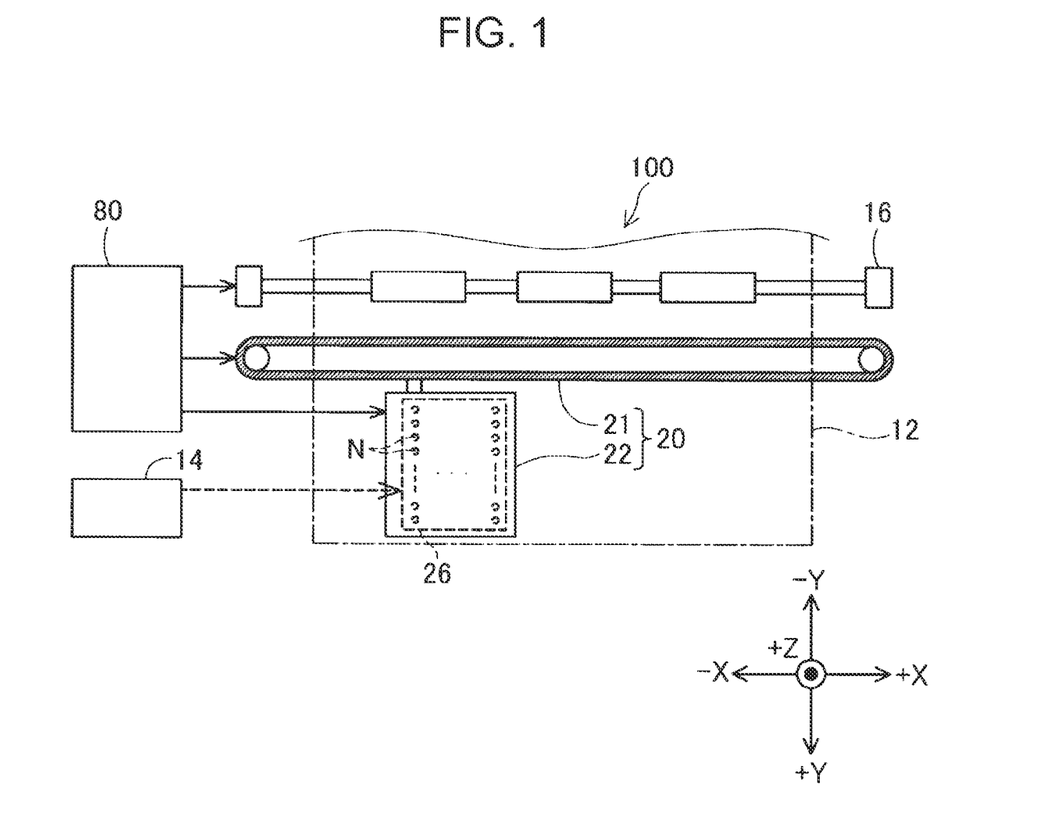
FIG. 1 is a schematic view illustrating an outline configuration of a liquid ejecting apparatus.

FIG. 1 is a schematic view illustrating an outline configuration of a liquid ejecting apparatus 100 according to an embodiment. The liquid ejecting apparatus 100 is an ink jet printing apparatus that performs printing by ejecting liquid droplets of ink, which is a liquid, onto a medium 12. As the medium 12, it is possible to employ a printing target of an arbitrary material such as a resin film or a cloth, in addition to a printing sheet. In the following description, an X direction, a Y direction, and a Z direction that perpendicularly intersect each other are used. When orientations are to be specified, positive and negative signs are used together with notations of directions with a positive direction represented with "+" and a negative direction represented with "−". In the present embodiment, the X direction is a main scanning direction that is a moving direction of a liquid ejecting head 26. The Y direction is a sub scanning direction that is a medium feeding direction that perpendicularly intersects the main scanning direction. The −Z direction is an ink ejection direction.

The liquid ejecting apparatus 100 includes the liquid ejecting head 26, a head moving mechanism 20, a liquid accommodation section 14, a transport mechanism 16, and a control section 80.

The liquid accommodation section 14 accommodates ink to be supplied to the liquid ejecting head 26. As the liquid accommodation section 14, it is possible to use a bag-shaped liquid pack formed with a flexible film, an ink tank that can be refilled with the ink, a detachable ink cartridge, or the like.

The liquid ejecting head 26 has a plurality of nozzles N for ejecting the ink. The plurality of nozzles N are aligned in the Y direction. The liquid ejecting head 26 ejects the ink, which is supplied from the liquid accommodation section 14, from the plurality of nozzles N toward the medium 12.

The head moving mechanism 20 includes a transport belt 21 and a carriage 22 that accommodates the liquid ejecting head 26. The carriage 22 is coupled to the transport belt 21 and is caused to reciprocate in the X direction with drive of the transport belt 21. The transport mechanism 16 transports the medium 12 in the +Y direction.

The control section 80 includes a processing circuit such as one or more central processing units (CPUs) or field programmable gate arrays (FPGAs) and a storage circuit such as a semiconductor memory and controls operations of the entire liquid ejecting apparatus 100. The control section 80 is electrically coupled to the transport mechanism 16, the head moving mechanism 20, and the liquid ejecting head 26 and controls each part. An image is printed on the medium 12 by the liquid being ejected from the nozzles N onto the medium 12 transported by the transport mechanism 16.

A2. Configuration of Liquid Ejecting Head

Figure 2:
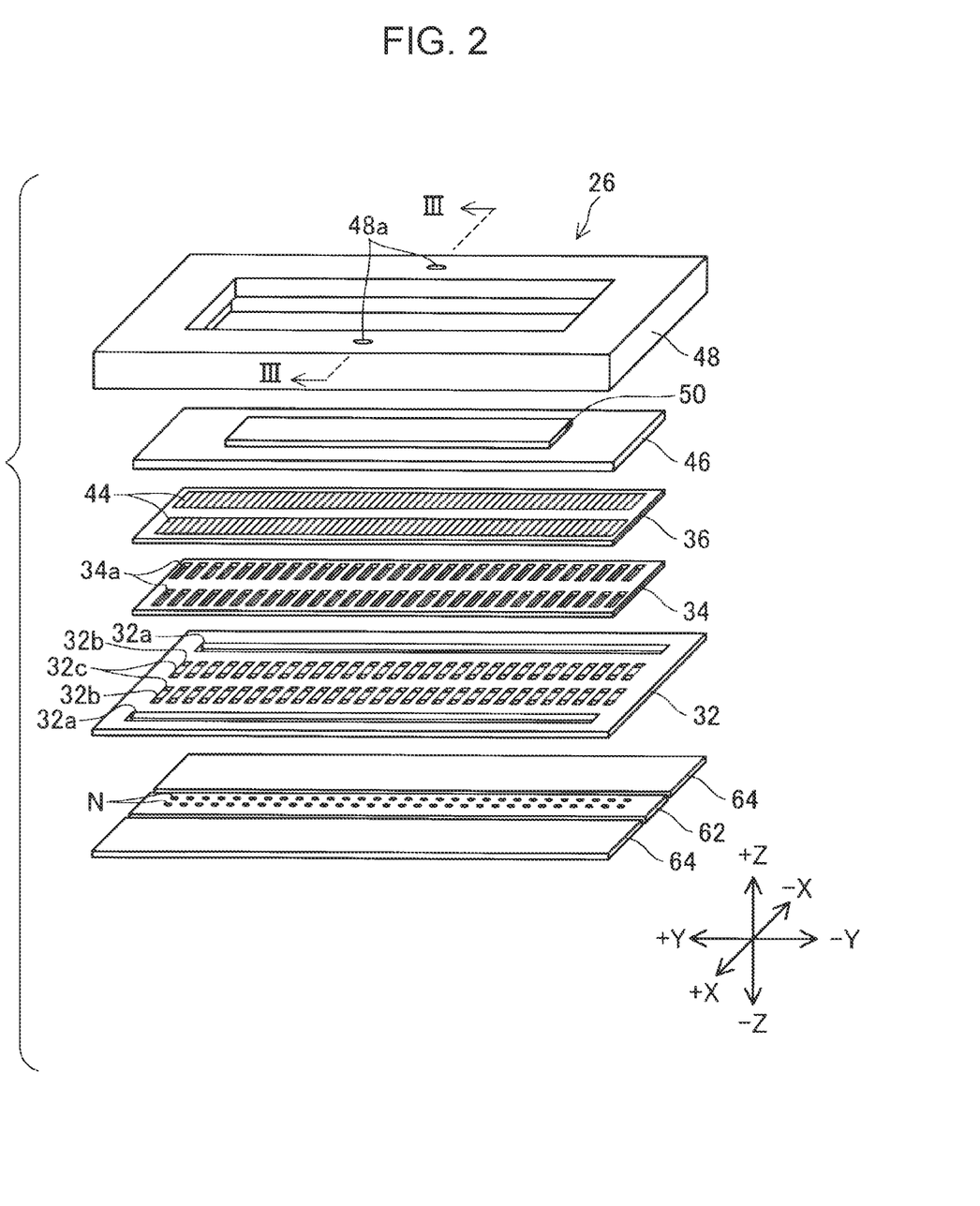
FIG. 2 is an exploded perspective view of a liquid ejecting head.
Figure 3:
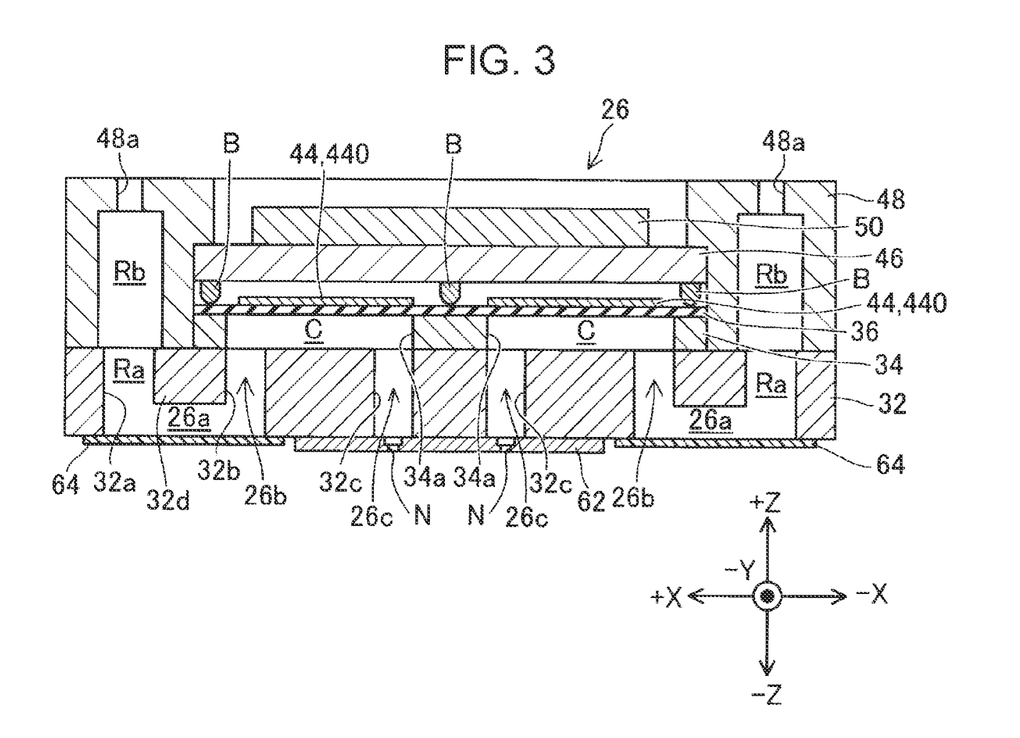
FIG. 3 is a sectional view along the line III-III in FIG. 2.
Figure 4:
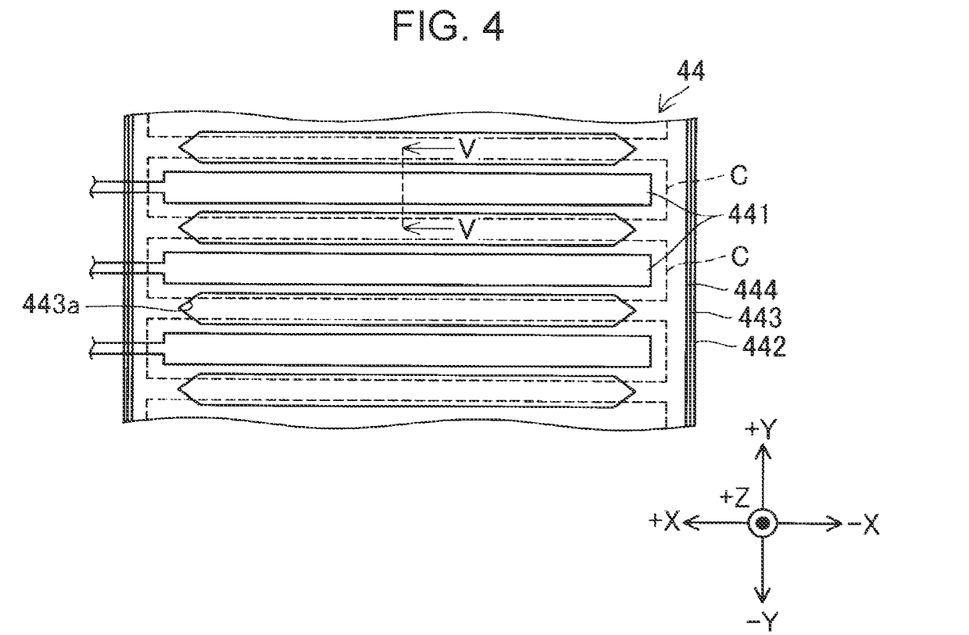
FIG. 4 is a plan view of a piezoelectric element.
Figure 5:
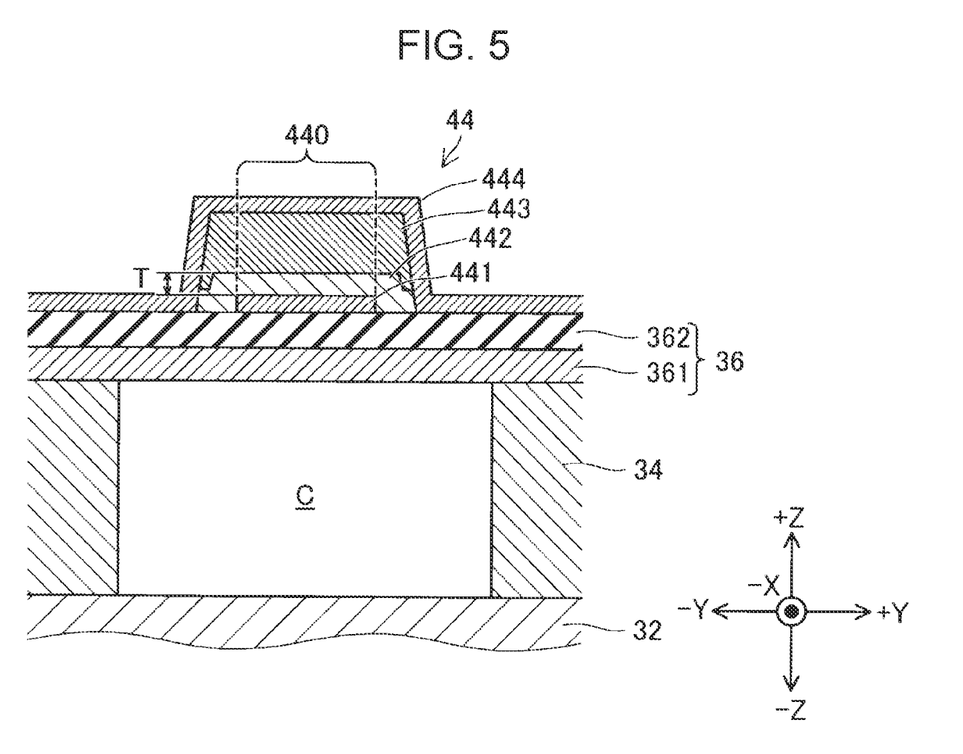
FIG. 5 is a sectional view along the line V-V in FIG. 4.

FIG. 2 is an exploded perspective view of the liquid ejecting head 26 according to the embodiment. FIG. 3 is a sectional view along the line III-III in FIG. 2. FIG. 4 is a plan view of a piezoelectric element 44. FIG. 5 is a sectional view along the line V-V in FIG. 4.

As illustrated in FIG. 2, the liquid ejecting head 26 has a nozzle plate 62, two vibration absorbers 64, a flow path substrate 32, a pressure chamber substrate 34, a diaphragm 36, a wiring substrate 46, a drive circuit 50, and a casing 48. The nozzle plate 62, the vibration absorbers 64, the flow path substrate 32, the pressure chamber substrate 34, the diaphragm 36, and the wiring substrate 46 are plate-shaped members that are long in the Y direction. Each of the nozzle plate 62, the flow path substrate 32, the pressure chamber substrate 34, and the diaphragm 36 has a substantially linear symmetrical structure with respect to a center line in the X direction. The sizes of the planar shapes of the pressure chamber substrate 34, the diaphragm 36, and the wiring substrate 46 are smaller than the sizes of the planar shapes of the flow path substrate 32 and the casing 48. For assembly, the nozzle plate 62 and the two vibration absorbers 64, the flow path substrate 32, the pressure chamber substrate 34, the diaphragm 36, the wiring substrate 46, and the casing 48 are laminated in this order and are caused to adhere to each other with an adhesive, for example.

The nozzle plate 62 is a plate-shaped member with a plurality of nozzles N formed therein. The nozzles N are through-holes with a substantially circular planar shape. The plurality of nozzles N are aligned along the Y direction. The number of arrays along which the plurality of nozzles N are aligned is two, and the two arrays are aligned in the X direction. The two vibration absorbers 64 are flexible films and are disposed with the nozzle plate 62 sandwiched therebetween in the X direction.

The flow path substrate 32 has two first openings 32a, a plurality of second openings 32b, and a plurality of third openings 32c. The planar shape of the first openings 32a is a rectangle that is long in the Y direction. The first openings 32a are formed along a side of the flow path substrate 32 that is parallel to the Y direction. The plurality of second openings 32b are aligned in the Y direction. Similarly, the plurality of third openings 32c are aligned in the Y direction. Each of the number of arrays of the second openings 32b and the number of the arrays of the third openings 32c is two. In the X direction, the first opening 32a, one array of the second openings 32b, one array of the third openings 32c, one array of the third openings 32c, and one array of the second openings 32b, and the first opening 32a are formed to be aligned in this order. Also, the second openings 32b that are adjacent to each other in the X direction and the third openings 32c are formed such that the positions thereof in the Y direction are substantially the same.

A plurality of openings 34a are formed in the pressure chamber substrate 34. The planar shape of the openings 34a is a rectangle that is long in the X direction. The plurality of openings 34a are aligned in the Y direction. The number of arrays in which the plurality of openings 34a are aligned is two, and the two arrays are formed to be aligned in the X direction. Note that the openings 34a are formed at positions at which the openings 34a overlap with the adjacent second openings 32b and third openings 32c that are formed in the flow path substrate 32 when seen from the Z direction.

Piezoelectric elements 44 are formed on the diaphragm 36 at positions at which the piezoelectric elements 44 overlap the openings 34a formed in the pressure chamber substrate 34 when seen from the Z direction.

The drive circuit 50 drives the piezoelectric elements 44. Specifically, the drive circuit 50 is realized by an integrated circuit (IC) chip that outputs drive signals and reference voltages for driving the piezoelectric elements 44. The drive circuit 50 is mounted on the wiring substrate 46. The wiring substrate 46 includes wirings for signals input to the drive circuit 50 and drive signals and reference voltage output from the drive circuit 50. As illustrated in FIG. 3, the wiring substrate 46 and the piezoelectric elements 44 are bonded via bumps B. The signals input to the drive circuit 50 are input to terminals formed on the wiring substrate 46, which are not illustrated, via flexible printed circuits (FPC), for example.

The casing 48 is a case for storing the ink and has a frame shape. In a case of lamination, the pressure chamber substrate 34, the diaphragm 36, and the wiring substrate 46 are disposed in an internal space of the casing 48. A through-hole 48a is formed at each of both ends of the casing 48 in the X direction.

Using FIG. 3, a sectional structure of the liquid ejecting head 26 will be described. A space Rb extending in the Y direction is formed at each of both ends of the casing 48 in the X direction. The spaces Rb communicates with the through-holes 48a. Spaces Ra, supply liquid chambers 26a, and supply flow paths 26b are formed by the flow path substrate 32 and the vibration absorbers 64 being coupled to each other. The spaces Ra are internal spaces of the first openings 32a. The supply liquid chambers 26a are spaces surrounded by separation walls 32d separating the first openings 32a from the second openings 32b and the vibration absorbers 64. The supply flow paths 26b are internal spaces of the second openings 32b. The spaces Ra communicate with the spaces Rb and the supply liquid chambers 26a, and the supply liquid chambers 26a communicate with the supply flow paths 26b. Pressure chambers C are formed by the pressure chamber substrate 34 and the diaphragm 36 being coupled to each other. The pressure chambers C are spaces surrounded by the openings 34a and the diaphragm 36. The pressure chambers C communicate with the supply flow paths 26b. Communication flow paths 26c are formed by the flow path substrate 32 and the nozzle plate 62 being coupled to each other. The communication flow paths 26c are internal spaces of the third openings 32c. The communication flow paths 26c communicate with the pressure chambers C and the nozzles N.

The space Ra and the space Rb function as a liquid storage chamber for storing the ink supplied to the pressure chambers C. The spaces Rb communicate with the plurality of spaces Ra aligned in the Y direction, and the ink supplied via the through-holes 48a is stored in the plurality of spaces Ra via the spaces Rb. The ink stored in the spaces Ra is distributed through the supply liquid chambers 26a and the supply flow paths 26b and is then supplied to the pressure chambers C.

In a plan view when seen from the Z direction, the piezoelectric elements 44 are disposed at positions at which the piezoelectric elements 44 overlap each of the two pressure chambers C, and the wiring substrate 46 and the drive circuit 50 are disposed to cover the two pressure chambers C. A drive signal and a reference voltage are input from the wiring substrate 46 to the piezoelectric elements 44 via the bumps B. The piezoelectric elements 44 are deformed by the drive signal and the reference voltage being input and by a voltage being applied thereto, the diaphragm 36 vibrates in conjunction with the deformation of the piezoelectric elements 44, the pressures inside the pressure chambers C vary, and the ink is thus ejected from the nozzles N.

A3. Configuration of Piezoelectric Element

As shown in FIG. 5, the diaphragm 36 as a substrate has a silicon substrate 361 and an insulating layer 362. Each piezoelectric element 44 is configured such that the first electrode 441, a seed layer 442, a piezoelectric layer 443, and a second electrode 444 are laminated in this order on the diaphragm 36. Here, portions at which the first electrode 441, the seed layer 442, the piezoelectric layer 443, and the second electrode 444 overlap each other when seen from the Z direction will be referred to as active sections 440. The active sections 440 are portions at which the piezoelectric layer 443 is deformed when a voltage is applied between the first electrode 441 and the second electrode 444.

Silicon dioxide is formed on a surface of the silicon substrate 361 located on the +Z direction side and being in contact with the insulating layer 362. The insulating layer 362 is made of zirconium oxide ($ZrO_2$). The first electrode 441 is made of a titanium (Ti) layer and a platinum (Pt) layer.

Note that the first electrode 441 is not limited to one including a plurality of layers including a Ti layer and a Pt layer, may be a single layer made of a metal material such as Ti, Pt, Iridium (Ir), aluminum (Al), nickel (Ni), gold (Au), or copper (Cu), for example, or may be formed by a plurality of layers from among these metal materials being laminated.

The seed layer 442 functions as an orientation control layer for controlling an orientation of the piezoelectric layer 443, which will be described later. The seed layer 442 is a composite oxide containing at least lead (Pb), bismuth (Bi), iron (Fe), and titanium (Ti). Specifically, the seed layer 442 is preferably a composite oxide represented by $Pb_x Bi_{(a-x)} Fe_y Ti_{(b-y)} O_z$. Here, a>x and b>y. Here, x/(a−x) preferably satisfies Expression (1) below.

$$0.04 < x/(a-x) < 1.40 \quad \text{Expression (1)}$$

Moreover, x/(a−x) preferably satisfies Expression (2) to orient the piezoelectric layer 443 in the (100) plane.

$$x/(a-x) < 0.72 \quad \text{Expression (2)}$$

Also, it is preferable that b=1, and a/b preferably satisfies Expression (3).

$$0.8 < (a/b) < 1.4 \quad \text{Expression (3)}$$

It is preferable that z satisfy Expression (4).

$$2.8 < z < 3.2 \quad \text{Expression (4)}$$

Note that the composition of the seed layer 442 in the above description is represented as a molar ratio of each element when a solution of an organic compound of each element is prepared by a solution method, which will be described later. In the present embodiment, a=1.2, b=1.0, x=0.1, and y=0.5. The seed layer 442 has a perovskite structure. The thickness T of the seed layer 442 is preferably equal to or more than 5 nm and equal to or less than 200 nm and is further preferably equal to or more than 5 nm and equal to or less than 100 nm. Also, a dielectric constant of the seed layer 442 is considered to be relatively high. Therefore, displacement efficiency represented by the amount of displacement of the piezoelectric layer 443 with respect to the applied voltage is high. Note that the seed layer 442 is not limited to the perovskite structure and may have a structure that is similar to the perovskite structure having an octahedron in which six oxygens (O) are coordinated to Fe or Ti, for example, a bismuth layered structure.

The piezoelectric layer 443 is configured with a composite oxide containing Pb, Zr, and Ti as constituent elements and having a perovskite structure. In the present embodiment, the piezoelectric layer 443 is a rhombohedral system and is made of lead zirconate titanate (PZT) having a perovskite structure. Note that the piezoelectric layer 443 is not limited to PZT, and for example, it is possible to use lead lanthanum zirconate titanate ((Pb, La) (Zr, Ti)$O_3$), lead niobate zirconium titanate (Pb(Zr, Ti, Nb)$O_3$), lead magnesium niobate zirconium titanate (Pb(Zr, Ti) (Mg, Nb)$O_3$), or the like. Also, the piezoelectric layer 443 does not necessarily contain lead, and for example, it is possible to use potassium sodium niobate (K, Na)Nb$O_3$), bismuth sodium titanate ((Bi, Na)Ti$O_3$), or bismuth ferrite (BiFeO). The particle diameter of the piezoelectric layer 443 is preferably equal to or less than 2 m and is further preferably 1 m. It is known that cracking is more likely to occur in the piezoelectric layer 443 when the particle diameter of the piezoelectric layer 443 is large. There is also a case in which durability of the piezoelectric layer is degraded when the particle diameter of the piezoelectric layer 443 is large. The particle diameter of the piezoelectric layer 443 is thus set to be equal to or less than 1 μm, such that it is possible to curb cracking occurring in the piezoelectric layer 443 and to curb degradation of durability. In the present embodiment, the particle diameter of the piezoelectric layer 443 is about several hundreds of nm.

When the first electrode 441 formed on the diaphragm 36 and the piezoelectric layer 443 formed on the seed layer 442 are analyzed from the lamination direction by the X-ray diffraction method, the peak intensity in the (100) plane is higher than the peak intensity in the (110) plane in the X-ray diffraction pattern measured by the X-ray diffraction method. Also, the peak intensity in the (100) plane is higher than the peak intensity in the (110) plane in the X-ray diffraction pattern, which is obtained by performing measurement on the piezoelectric layer 443 formed on the seed layer 442 formed on the diaphragm 36 by the X-ray diffraction method. In other words, the piezoelectric layer 443 is strongly oriented in the (100) plane in the lamination direction of the piezoelectric elements 44.

In general, it is known that in a case in which PZT constituting the piezoelectric layer 443 has a rhombohedral structure, the amount of displacement increases, that is, piezoelectric characteristics are improved if the PZT is oriented in the (100) plane. When the seed layer 442 is the composite oxide in the present embodiment, it is possible to cause the piezoelectric layer 443 to be oriented in the (100) plane. Therefore, it is possible to improve the piezoelectric characteristics of the piezoelectric layer 443 through the formation of the seed layer 442 in the present embodiment. Also, the thickness of the seed layer 442 is set to be equal to or more than 5 nm and equal to or less than 200 nm, such that it is possible to enhance displacement efficiency of the piezoelectric layer 443 and to satisfactorily cause the piezoelectric layer 443 to be oriented in the (100) plane. If the thickness of the seed layer 442 is thinner than 5 nm, it is more difficult to uniformly form the seed layer 442, and the effect of causing the piezoelectric layer 443 to be oriented in the (100) plane is degraded. If the thickness of the seed layer 442 is equal to or more than 200 nm, which is excessively thick, it is more difficult to apply the voltage to the piezoelectric layer 443 due to the dielectric constant of PZT that is higher than the dielectric constant of the seed layer 442, and displacement efficiency of the piezoelectric layer 443 is thus degraded. Also, the constituent elements of the seed layer 442 are close to the constituent elements of the piezoelectric layer 443, and it is thus possible to prevent the piezoelectric characteristics of the piezoelectric elements 44 from being easily degraded even if the constituent elements of the seed layer 442 are diffused in the piezoelectric layer 443. Moreover, since the seed layer 442 does not have conductivity, it is possible to employ the structure of the piezoelectric elements 44 in the present embodiment in which the seed layer 442 is in contact with the first electrodes 441 and the second electrode 444. Note that it is known that any structure that has piezoelectric characteristics and has a polarization axis in a direction other than the (100) direction, rather than PZT, improves the piezoelectric characteristics as long as there is an orientation in the (100) plane similarly to PZT.

The second electrode 444 is made of Ir. Note that the second electrode 444 is not limited to Ir, may be a single layer of a metal material such as Pt, Al, Ni, Au, or Cu, for example, or may be formed by a plurality of layers from among these metal materials being laminated.

As illustrated in FIG. 4, the first electrodes 441 are formed for each pressure chamber C, that is, for each active section 440. The first electrodes 441 are drawn in the +X direction and are individually electrically coupled to the drive circuit 50. On the other hand, the second electrode 444 is formed to cover the plurality of active sections 440 aligned in the Y direction. In other words, the first electrodes 441 are individually provided for the plurality of active sections 440 while the second electrode 444 is provided commonly to the plurality of active sections 440. Individual voltages for the active sections 440 are applied to the first electrodes 441, and a voltage common to the plurality of active sections 440 aligned in the Y direction is applied to the second electrode 444. The piezoelectric layer 443 is formed to have through-holes 443a between adjacent active sections 440. The through-holes 443a are regions where the piezoelectric layer 443 is not formed. The seed layer 442 is formed to cover the plurality of piezoelectric elements 44 aligned in the Y direction.

A4. Method for Producing Piezoelectric Element

First, the diaphragm 36 is produced. Specifically, silicon dioxide is formed on the surface in the +Z direction by thermally oxidizing the silicon substrate 361. Next, a Zr layer is formed by a sputtering method to thermally oxidize Zr, thereby forming a ZrO₂ layer that serves as the insulating layer 362.

Next, the first electrodes 441 are formed. Specifically, a Ti layer and a Pt layer are laminated in order by the sputtering method. Next, the Ti layer and the Pt layer are patterned using photolithography. Specifically, a resist is applied to the Pt layer, and after exposure, Ti and Pt are ion-milled. Next, the resist is removed through oxygen plasma ashing, and the substrate is washed.

Next, the seed layer 442 is formed by a metal organic decomposition (MOD) method. Specifically, a propionic acid solution of Pb, Bi, Fe, and Ti adjusted to have a molar ratio Pb:Bi:Fe:Ti=10:110:50:50 is applied to the diaphragm 36 by a spin coating method first. Next, a hot plate is used to perform drying and degreasing at 350°. Then, heating treatment is performed at 700° C. for 5 minutes by rapid thermal annealing (RTA).

Next, the piezoelectric layer 443 is formed by a solution method. As a specific forming method, an acetic acid solution of Pb, Zr, and Ti adjusted to have a molar ratio Pb:Zr:Ti=118:52:48 is applied to the seed layer 442 by a spin coating method first. Next, a hot plate is used to perform drying and degreasing at 200° C. and 410° C. Then, heating treatment is performed at 740° C. for 5 minutes by rapid thermal annealing (RTA).

Next, the second electrode 444 is formed. Specifically, Ir is laminated by a sputtering method. Then, photolithography is used to pattern the Ir layer.

B. Other Embodiments (B1) In the aforementioned embodiment, the first electrodes 441 are formed for each of the active sections 440, and the second electrode 444 is provided commonly to the plurality of active sections 440 aligned in the Y direction. On the other hand, the first electrode 441 may be provided commonly to the plurality of active sections 440 aligned in the Y direction, and the second electrodes 444 may be provided for each of the active sections 440.

(B2) The method for producing the piezoelectric elements 44 is not limited to the above method. For example, the etching performed to pattern the first electrodes 441 may be performed by an etching method other than ion milling. Also, the method for forming the seed layer 442 is not limited to the MOD method and may be another method such as a sol-gel method or a sputtering method.

(B3) In the aforementioned embodiment, the first electrodes 441 are formed by the Ti layer and the Pt layer being laminated, and the first electrodes 441 are drawn in the +X direction to be electrically coupled to the drive circuit 50. On the other hand, a configuration in which a wiring made of Ir is included between the first electrodes 441 and the seed layer 442, the first electrodes 441 is not drawn outward beyond the active sections 440 in a plan view, and the wiring made of Ir is conductive with the first electrodes 441 and the drive circuit 50 may be employed. Note that in the case of this configuration, the seed layer 442 is formed on the ZrO₂ layer, the Pt layer, and the Ir layer. In this configuration, the peak intensity in the (100) plane is higher than the peak intensity in the (110) plane in the X-ray diffraction pattern obtained by measuring the first electrodes 441 formed on the diaphragm 36, the wiring made of Ir, and the piezoelectric layer 443 formed on the seed layer 442 by the X-ray diffraction method. Although the first electrodes 441 are formed by the Ti layer and the Pt layer being laminated in the aforementioned embodiment, the first electrodes 441 may be formed by a Ti layer, a Pt layer, and an Ir layer are laminated in this order.

C. Examples and Comparative Examples

C1: Production of Seed Layer and Piezoelectric Layer

Figure 6:
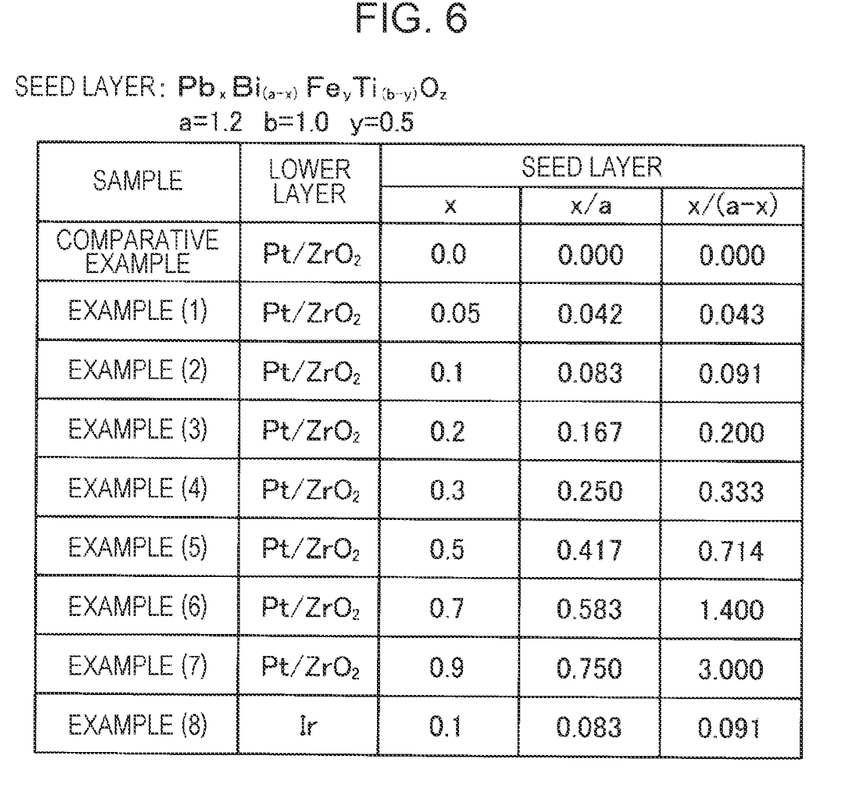
FIG. 6 is a table illustrating compositions of seed layers in Examples (1) to (8) and Comparative Example.

Production in Examples (1) to (8) and Comparative Example was carried out with the composition ratios of the seed layers, specifically, the content of Pb changed. FIG. 6 illustrates compositions of the seed layers produced in Examples (1) to (8) and Comparative Example. The compositions of the seed layers in Examples (1) to (8) and Comparative Example are represented by $Pb_xBi_{(a-x)}Fe_yTi_{(b-y)}O_z$. In the seed layers in Examples (1) to (8), a=1.2, and x was a value that is equal to or more than 0.05 and equal to or less than 0.9. The seed layer in Comparative Example was a composite oxide of x=0, that is, that did not contain Pb. The uppermost layers of the first electrode layers in Examples (1) to (7) and Comparative Example were Pt layers. Example (8) was for the configuration of another embodiment (B3) described above, an Ir layer was formed on a first electrode layer, and a seed layer and a piezoelectric layer was formed on the Ir layer. In FIG. 6, x/a representing substitution rates of Pb are illustrated along with the compositions of the seed layers. In the sections for "Lower layer" in FIG. 6, configurations of the lower layers of the seed layers at portions where measurement was carried out when measurement of X-ray diffraction patterns, which will be described later, was carried out.

In each of Examples and Comparative Example, the seed layers and the piezoelectric layers are formed on the diaphragms by a production method similar to that described above. Specifically, silicon dioxide was formed by thermally oxidizing silicon substrates first. Next, Zr layers were formed by a sputtering method, and $ZrO_2$ layers were formed by thermally oxidizing the Zr layers. In Examples (1) to (7) and Comparative Example, Ti layers and Pt layers were laminated in order by a sputtering method after the $ZrO_2$ layers were formed. Next, the Ti layer and the Pt layer were patterned using photolithography. Then, the seed layers and the piezoelectric layers were formed. In Example (8), the Ti layer, the Pt layer, and the Ir layer were laminated in order after the $ZrO_2$ layer was formed. Next, photolithography was used to pattern the Ti layer, the Pt layer, and the Ir layer. Then, the seed layers and the piezoelectric layers were formed.

In Examples (1) to (8), propionic acid solutions of Pb, Bi, Fe, and Ti adjusted to have each molar ratio were applied to the diaphragms by a spin coating method for the seed layers. Next, a hot plate was used to perform drying and degreasing at 350°. Then, heating treatment was performed at 700° C. for 5 minutes by rapid thermal annealing (RTA). In Comparative Example, a propionic acid solution that did not contain Pb was used, drying, degreasing, and heating treatment were performed after the application, thereby forming the seed layer. The ratio of each element in the propionic acid solution in Comparative Example was Bi:Fe:Ti=120:50:50 in terms of a molar ratio.

The piezoelectric layers were made of PZT. The piezoelectric layers were similarly formed in Examples (1) to (8) and Comparative Example. Specifically, an acetic acid solution of Pb, Zr, and Ti adjusted to have a molar ratio Pb:Zr:Ti=118:52:48 was applied to each seed layer by a spin coating method first. Next, a hot plate was used to perform drying and degreasing at 200° C. and 410° C. Then, heating treatment was performed at 740° C. for 5 minutes by rapid thermal annealing (RTA).

C2: Evaluation of Piezoelectric Layer

X-ray diffraction patterns in Examples (1) to (8) and Comparative Example were measured to evaluate degrees of orientation of the piezoelectric layers. An X-ray diffractometer D8 DISCOVER with GADDS manufactured by Bruker was used. As measurement conditions, a tube voltage was set to 50 kV, a tube current was set to 100 mA, the detector distance was set to 15 cm, the collimator diameter was set to 0.1 mm, and the measurement time was set to 180 seconds. Two-dimensional data obtained through the measurement was converted into X-ray diffraction intensity curves by an intensity normalization method Bin normalized with a 2θ range of 20° to 40°, an x range of −95° to −85°, and a step width of 0.02°. In Examples (1) to (7), there were portions of the seed layers and the piezoelectric layers formed on Pt and portions of the seed layers and the piezoelectric layers formed on $ZrO_2$ through the patterning of the Ti layers and the Pt layers. In the measurement of the X-ray diffraction pattern, the measurement was performed on the portion of the seed layer and the piezoelectric layer formed on Pt and the portion of the seed layer and the piezoelectric layer formed on $ZrO_2$. Similarly, there were portions of the seed layer and the piezoelectric layer formed on Ir and portions of the seed layers and the piezoelectric layer formed on $ZrO_2$ through the patterning of the Ti layer, the Pt layer, and the Ir layer in Example (8). Among these, measurement was performed on portions of the seed layer and the piezoelectric layer formed on Ir in Example (8).

Figure 7:
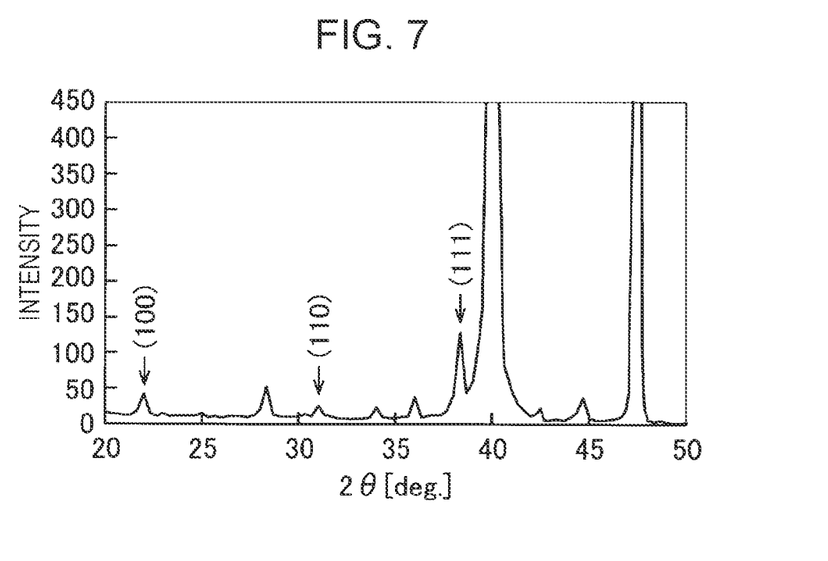
FIG. 7 is an X-ray diffraction pattern measured on platinum in Comparative Example.
Figure 8:
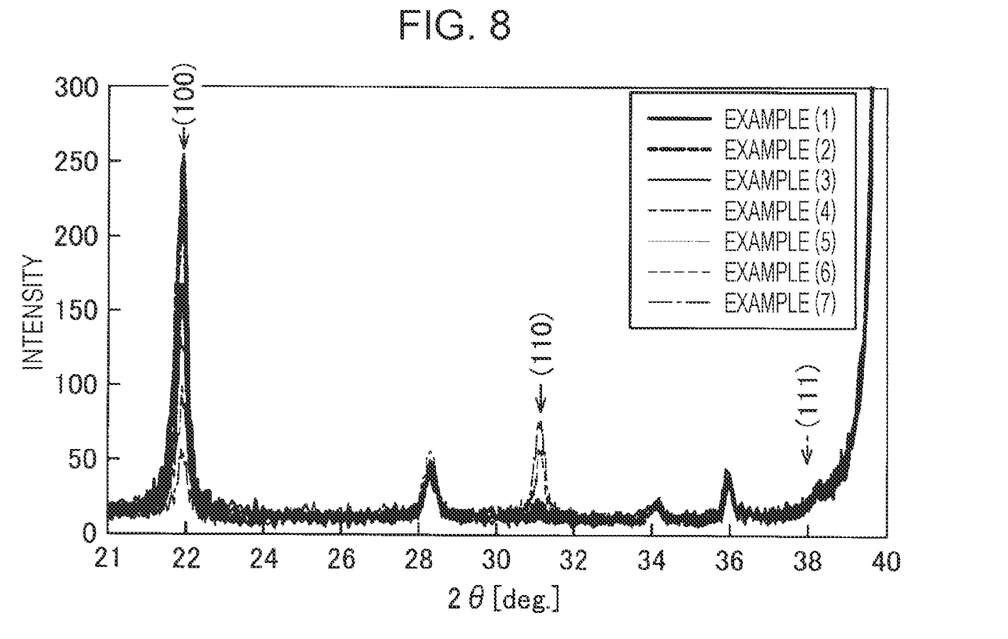
FIG. 8 is X-ray diffraction patterns measured on platinum in Examples (1) to (7).
Figure 9:
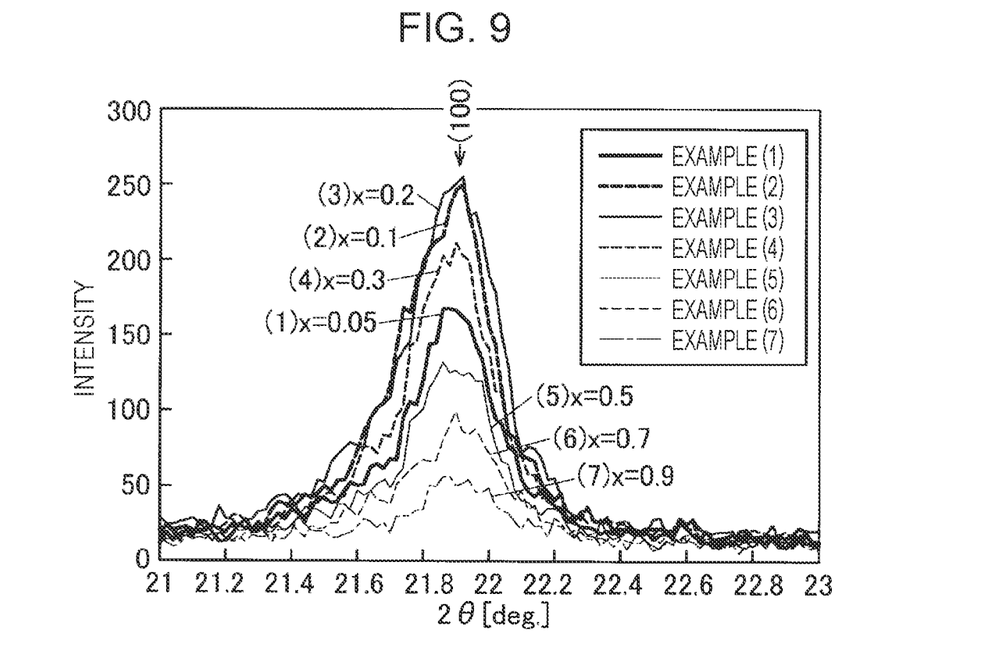
FIG. 9 is an enlarged view near (100) peaks of the X-ray diffraction patterns measured on platinum in Examples (1) to (7).
Figure 10:
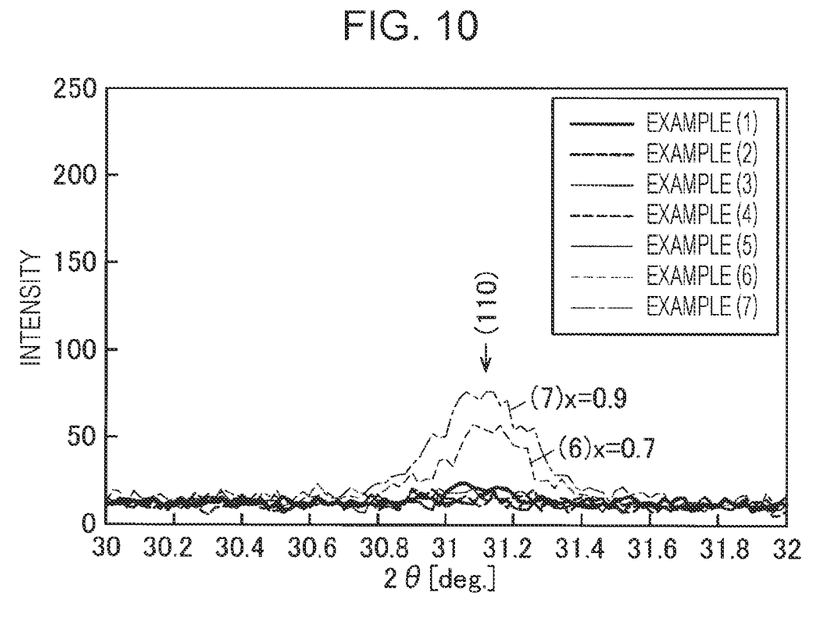
FIG. 10 is an enlarged view near (110) peaks of the X-ray diffraction patterns measured on platinum in Examples (1) to (7).
Figure 11:
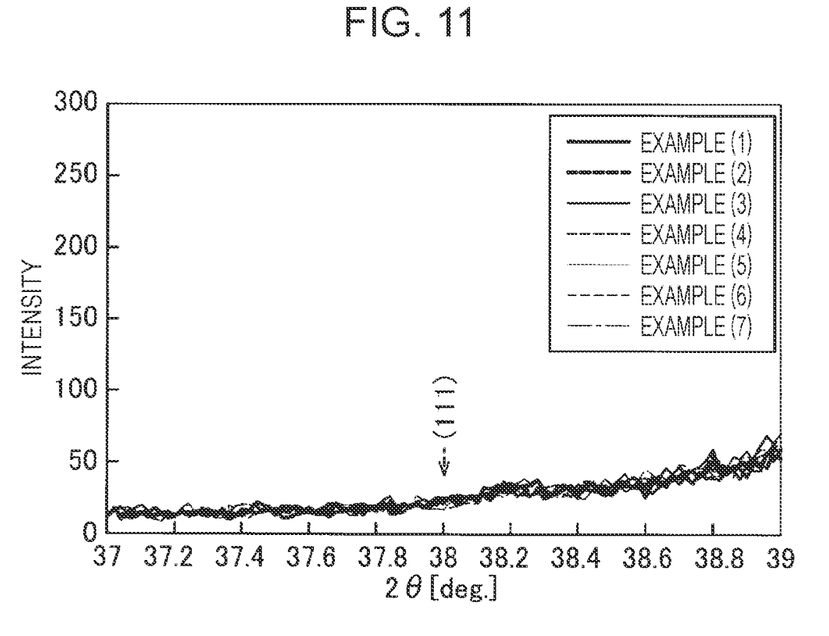
FIG. 11 is an enlarged view near (111) peaks of the X-ray diffraction patterns measured on platinum in Examples (1) to (7).

FIG. 7 illustrates an X-ray diffraction pattern measured on Pt in Comparative Example. FIG. 8 illustrates X-ray diffraction patterns measured on Pt in Examples (1) to (7). In the X-ray diffraction pattern in Comparative Example, the peak intensity in the (100) plane near 22θ was low, the peak intensity in the (110) plane was observed near 31°, and the peak intensity in the (111) plane near 38° was high. On the other hand, in the X-ray diffraction patterns measured on Pt in Examples (1) to (7), the peak intensities in (100) planes were generally high. FIGS. 9 to 11 are X-ray diffraction patterns in Examples (1) to (7) in which a part near the peaks in the (100) plane, a part near the peaks in (110), and a part near the peaks in (111) are enlarged, respectively. As illustrated in FIG. 9, the peak intensities in the (100) plane were lower in order of Example (3), Example (2), Example (4), Example (1), Example (5), Example (6), and Example (7). As illustrated in FIG. 10, the peaks in the (110) plane were observed in Example (6) and Example (7). In Examples (6) and (7), the peaks in the (110) plane were observed, the peak intensities in the (100) plane were low, and it is thus possible to consider that the effect of orienting PZT in the (100) plane was low in the seed layers in which x/(a−x) indicating the substitution rates of Pb were equal to or more than 1.400 and x/a was equal to or more than 0.583. On the other hand, in Examples (1) to (5), no peaks in the (110) plane were observed, the peak intensities in the (100) plane were high, and the effect of orienting PZT in the (100) plane was considered to be high in the seed layers in which x/(a−x) was equal to or less than 0.714 and x/a is equal to or less than 0.417. As described above, it was possible to cause PZT to be oriented in the (100) plane when the seed layer laminated on the Pt layer and represented by $Pb_xBi_{(a-x)}Fe_yTi_{(b-y)}O_z$ had a composition that satisfies 0.04<x/(a−x)<1.40 and 0.04<(x/a)<0.58. Moreover, the effect of causing PZT to be oriented in the (100) plane can be enhanced in a case of a composition that satisfies x/(a−x)<0.72 and (x/a)<0.42. Note that as illustrated in FIG. 11, no peaks in the (111) plane were observed in Examples (1) to (7).

Figure 12:
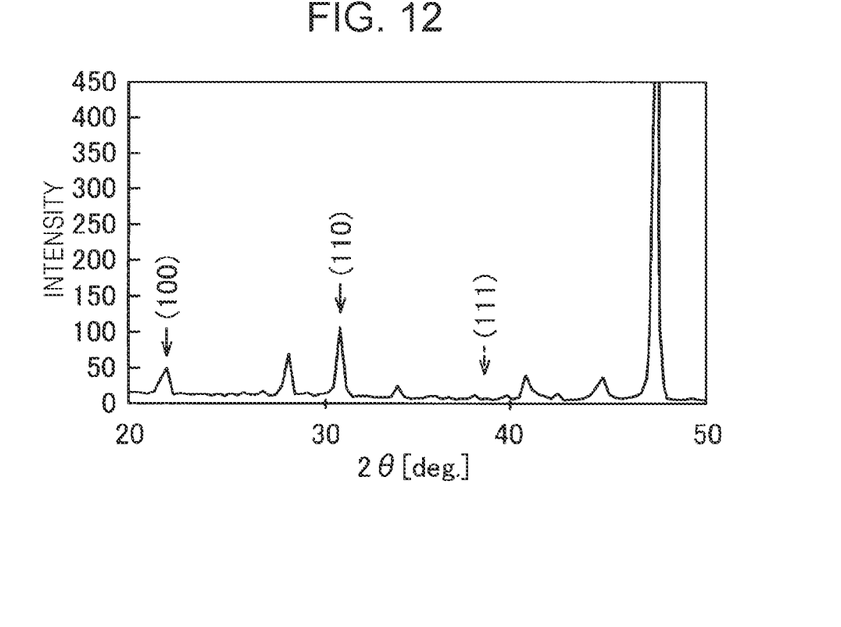
FIG. 12 is X-ray diffraction patterns measured on zirconium oxide in Comparative Example.
Figure 13:
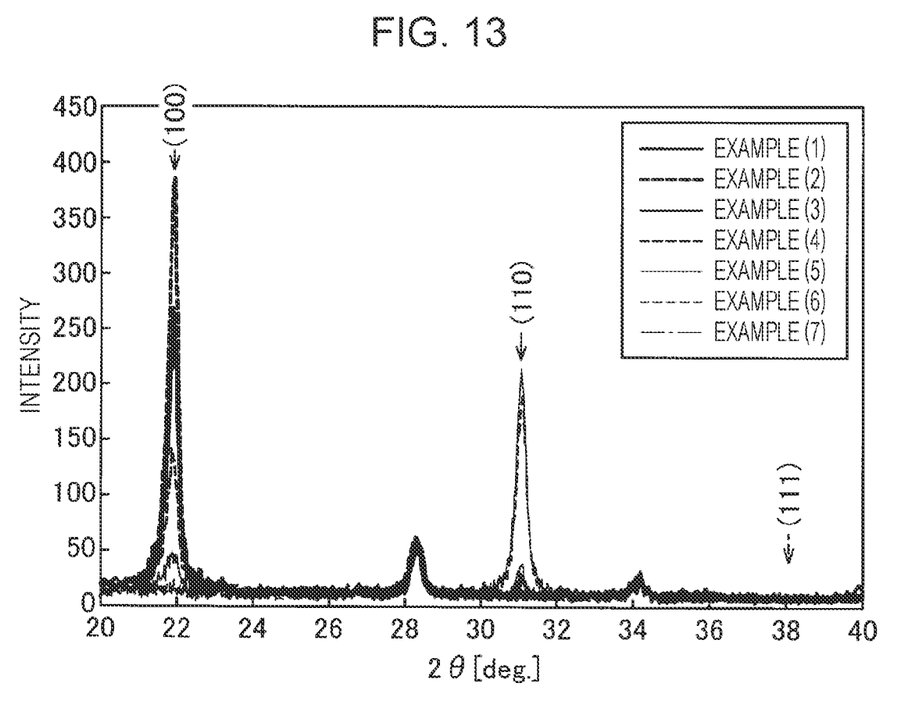
FIG. 13 is X-ray diffraction patterns measured on zirconium oxide in Examples (1) to (7).

FIG. 12 illustrates an X-ray diffraction pattern measured on $ZrO_2$ in Comparative Example. FIG. 13 illustrates X-ray diffraction patterns measured on $ZrO_2$ in Examples (1) to (7). The X-ray diffraction patterns measured on $ZrO_2$ presented tendencies similar to those of the X-ray diffraction patterns measured on Pt. In the X-ray diffraction pattern in Comparative Example, the peak intensity in the (100) plane near 22° was low, and the peak intensity in the (110) plane near 32° was high. On the other hand, the peak intensities of the X-ray diffraction patterns measured on $ZrO_2$ in Examples (1) to (7) in the (100) plane were generally high.

Figure 14:
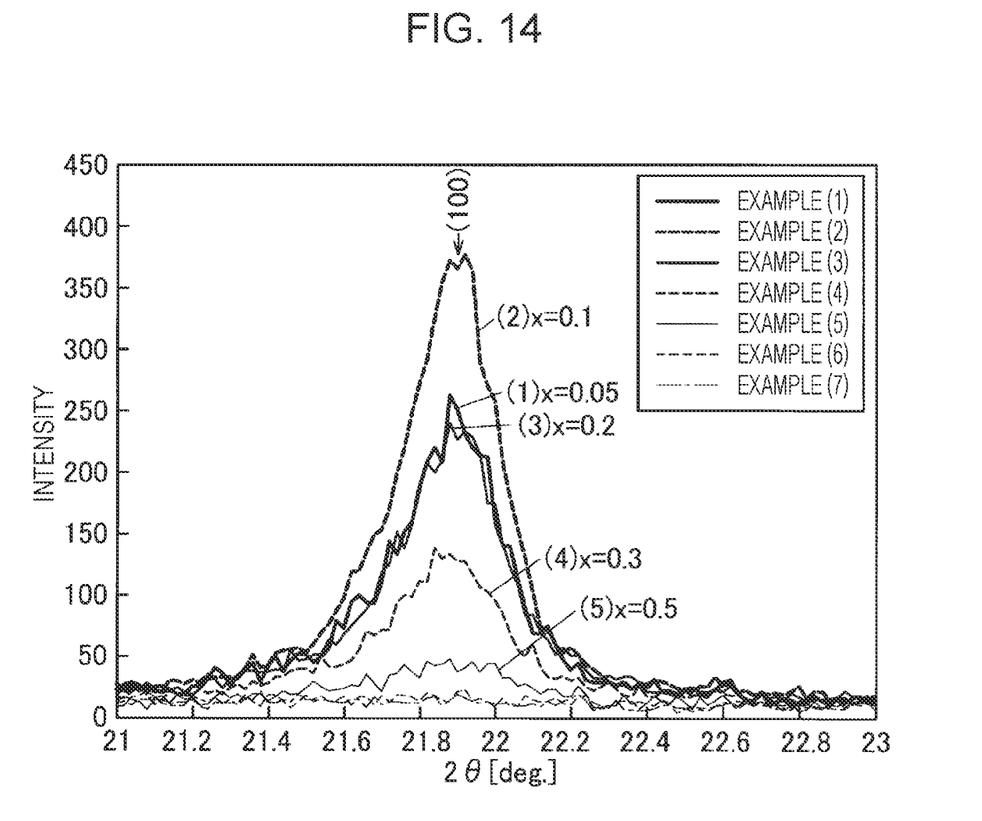
FIG. 14 is an enlarged view near (100) peaks of the X-ray diffraction patterns measured on zirconium oxide in Examples (1) to (7).
Figure 15:
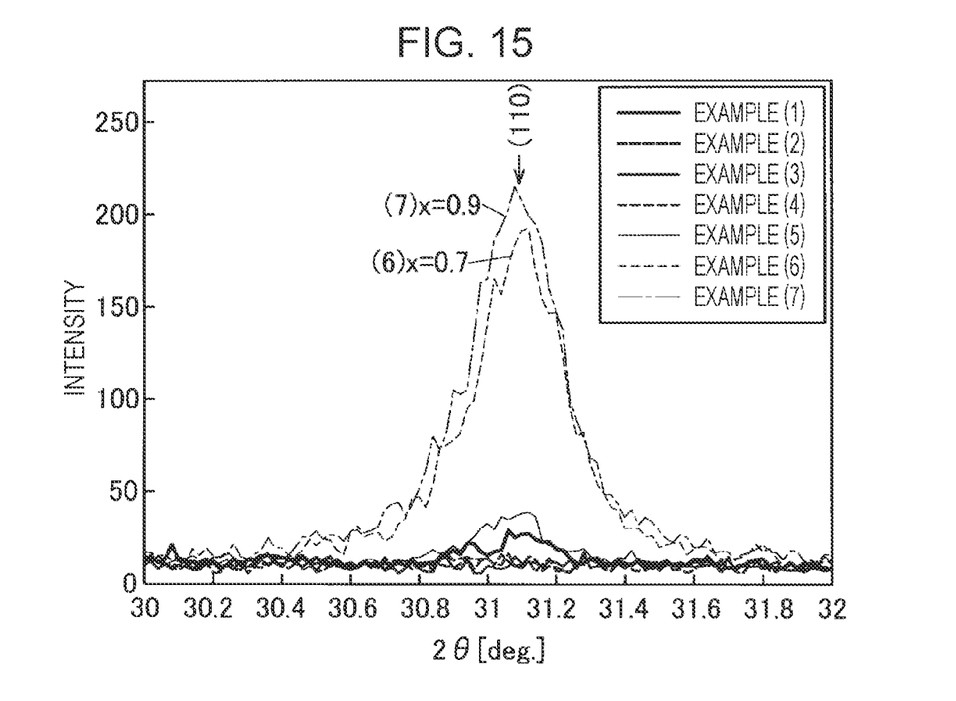
FIG. 15 is an enlarged view near (110) peaks of the X-ray diffraction patterns measured on zirconium oxide in Examples (1) to (7).
Figure 16:
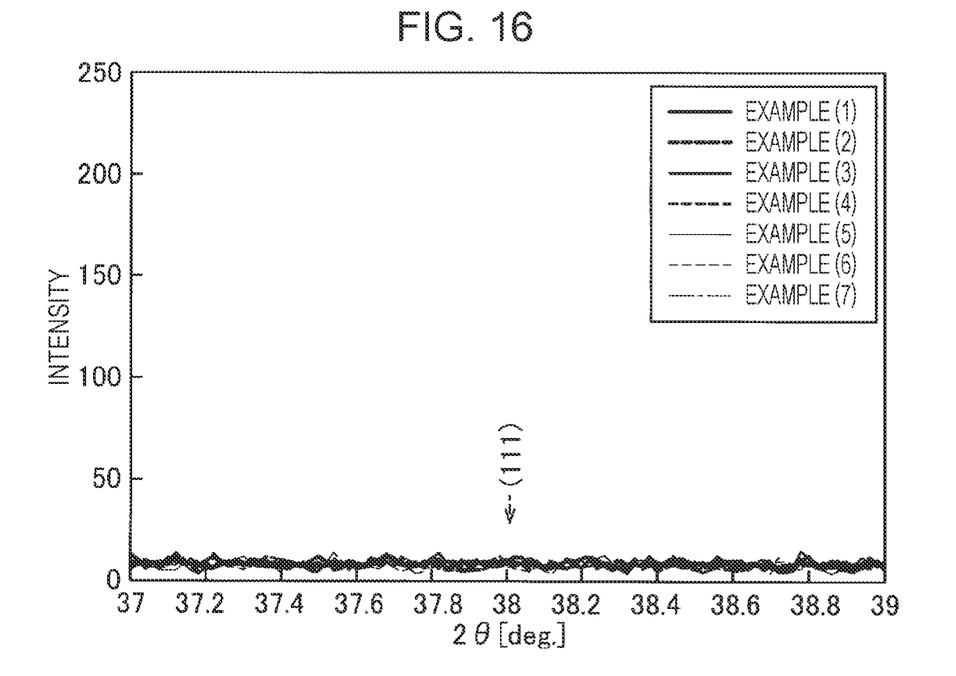
FIG. 16 is an enlarged view near (111) peaks of the X-ray diffraction pattern measured on zirconium oxide in Examples (1) to (7).

FIGS. 14 to 16 are X-ray diffraction patterns on $ZrO_2$ in Examples (1) to (7) in which a part near the peaks in the (100) plane, a part near the peaks in the (110) plane, and a part near the peaks in the (111) plane, are enlarged, respectively. As illustrated in FIG. 14, the peak intensities in the (100) plane were lower in order in the order of Example (2), Example (1), Example (3), Example (4), and Example (5). Also, no peaks in the (100) plane were observed in Example (6) and Example (7). As illustrated in FIG. 15, the peak intensities in the (110) plane were high in Example (6) and Example (7). In Example (6) and Example (7), the peak intensities in the (110) plane were high, no peaks in the (100) plane were observed, and the effect of orienting PZT in the (100) plane was thus considered to be low in the seed layers in which x/a was equal to or more than 0.583. On the other hand, in Examples (1) to (5), no peaks in the (110) plane were observed, or the peak intensities were low, the peaks in the (100) plane were observed, and the effect of orienting PZT in the (100) plane was thus considered to be high in the seed layers in which x/(a−x) was equal to or less than 0.714 and x/a was equal to or less than 0.417. As described above, it is possible to cause PZT to be oriented in the (100) plane when the seed layer laminated on $ZrO_2$ and represented by $Pb_xBi_{(a-x)}Fe_yTi_{(b-y)}O_z$ had a composition that satisfies 0.04<x/(a−x)<1.40 and 0.04<(x/a)<0.58. Moreover, the effect of causing PZT to be oriented in the (100) plane can be enhanced in a case of a composition that satisfies x/(a−x)<0.72 and (x/a)<0.42. Note that as illustrated in FIG. 16, no peaks in the (111) plane were observed in Examples (1) to (7).

Figure 17:
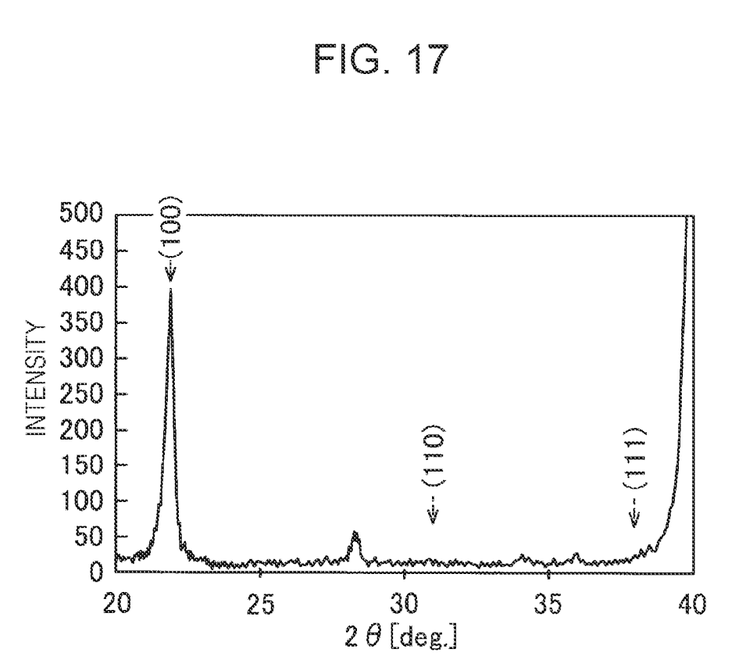
FIG. 17 is an X-ray diffraction pattern measured on iridium in Example (8).

FIG. 17 illustrates an X-ray diffraction pattern measured on Ir in Example (8). The X-ray diffraction pattern measured on Ir presented tendencies similar to those of the X-ray diffraction pattern measured on Pt. In the X-ray diffraction pattern measured on Ir, the peak intensity in the (100) plane was high, and neither the peak intensity in the (110) plane nor the peak in the (111) plane were observed. As described above, it is possible to cause PZT to be oriented in the (100) plane for the seed layer laminated on Ir and represented by $Pb_xBi_{(a-x)}Fe_yTi_{(b-y)}O_z$. Note that the X-ray diffraction pattern in Example (8) was similar to the X-ray diffraction pattern on Pt in Example (2) in which the seed layer with the same composition as that in Example (8) was included. Therefore, there is considered to be the effect of causing the piezoelectric layer formed on the seed layer formed on Ir and having a composition other than the composition in Example (8) to be oriented in the (100) plane.

Lotgering factors were evaluated using JCPDS Card No. 330784 based on (a) the X-ray diffraction pattern measured on Pt in Comparative Example, (b) the X-ray diffraction pattern measured on $ZrO_2$ in Comparative Example, (c) X-ray diffraction pattern measured on Pt in Example (2), and the X-ray diffraction pattern measured on $ZrO_2$ in Example (2). The lotgering factors are indexes having one as a maximum number and indicating a degree of orientation. The calculated lotgering factors were as follows.

(a) 0.13
(b) 0.21
(c) 0.99
(d) 0.99

The lotgering factors on both Pt and $ZrO_2$ were high values in Example 2, and PZT was strongly oriented in the (100) plane.

In a process of producing the piezoelectric elements 44, the Ti layer and the Pt layer that served as the first electrodes 441 were formed, and patterning using photolithography was performed thereon. In the patterning process, there minute irregularities may be formed on the surfaces of the first electrodes 441 due to a small amount of remaining resist, for example. In a case in which irregularities are formed on the surfaces of the first electrodes 441, the seed layer 442 may not satisfactorily be formed, and the piezoelectric layer 443 may not be oriented in the (100) plane. In this regard, according to the seed layer 442 in the present embodiment, it is possible to cause the piezoelectric layer 443 to be oriented in the (100) plane even if patterning is performed, as is represented by the results of the X-ray diffraction.

Also, as can be seen in FIGS. 6, 8, 13, and 17, the piezoelectric layer 443 is oriented in the (100) plane regardless of which of Pt, $ZrO_2$, and Ir the layer with the seed layer 442 laminated thereon is made of, in the seed layer 442 according to the present embodiment. In other words, according to the seed layer 442 in the present embodiment, it is possible to cause the piezoelectric layer 443 to be oriented in the (100) plane regardless of the layer on which the seed layer 442 is laminated.

Further, when integrated values of the peak intensities in the (100) plane near 220 are similar, it is more preferable that the peak intensity steeply occurs at a local part in the vicinity of 22° than that the peak intensity occurs in a uniformly dispersed manner in the vicinity of 22°. Since orientations of crystals are more aligned in a case in which the peak intensity steeply occurs, directions of forces acting on the piezoelectric layer 443 at the time of driving do not significantly vary, and it is possible to reduce occurrence of cracking or the like. Here, in the case in which the peak intensity is steep, the half width of the rocking curve decreases. In other words, it is possible to evaluate how unlikely cracking is to occur due to variations in peak intensity, based on the half width of the rocking curve. Specifically, the half width of the rocking curve in the (100) plane is preferably equal to or less than 8.4° and is particularly preferably equal to or less than 3.2° under the measurement conditions in the present embodiment.

Also, an arithmetic mean roughness of the piezoelectric layer 443 in the +Z direction is preferably small, that is, the piezoelectric layer 443 is preferably flat, to some extent. Since the contact area between the second electrode 444 provided to be laminated on the piezoelectric layer 443 on the +Z direction side and the piezoelectric layer 443 increases as the piezoelectric layer 443 is flatter, it is possible to enhance adhesion and thereby to improve durability. Also, in a case in which large irregularities are included, the contact portion between the piezoelectric layer 443 and the second electrode 444 is limited to projection portions of the piezoelectric layer 443, and there is thus a concern that electric charges may concentrate on the projection portions. If the piezoelectric layer 443 is flat, it is also possible to curb concentration of electric charge on the specific part. Specifically, the arithmetic mean roughness of the piezoelectric layer 443 in the +Z direction is preferably equal to or less than 2.8 nm and is particularly preferably equal to or less than 1.0 nm.

D. Other Aspects

The present disclosure is not limited to the aforementioned embodiment and can be realized in various configurations without departing from the gist thereof. For example, technical features of the embodiment corresponding to the technical features in each aspect described in the summary of the present disclosure can appropriately be replaced or combined in order to solve some or all of the aforementioned problems or achieve some or all the aforementioned effects. Moreover, it is possible to appropriately delete the technical features as long as there are no descriptions that the technical features are essential in the specification.

(1) According to an aspect of the present disclosure, a piezoelectric element is provided. The piezoelectric element is a piezoelectric element in which a first electrode, a seed layer, a piezoelectric layer, a second electrode are laminated on a substrate, and the seed layer is a composite oxide containing at least Pb, Bi, Fe, and Ti. According to the aspect, it is possible to cause the piezoelectric layer to be oriented in the (100) plane.

(2) In the piezoelectric element according to the above aspect, the composite oxide included in the seed layer is represented by $Pb_xBi_{(a-x)}Fe_yTi_{(b-y)}O_z$. Here, a>x and b>y. According to the aspect, it is possible to cause the piezoelectric layer to be oriented in the (100) plane.

(3) In the piezoelectric element according to the above aspect, 0.04<x/(a-x)<1.40. According to the aspect, it is possible to cause the piezoelectric layer to be oriented in the (100) plane.

(4) In the piezoelectric element according to the above aspect, x/(a-x)<0.72. According to the aspect, it is possible to cause the piezoelectric layer to be oriented in the (100) plane.

(5) In the piezoelectric element according to the above aspect, 0.8<(a/b)<1.4. According to the aspect, it is possible to cause the piezoelectric layer to be oriented in the (100) plane.

(6) In the piezoelectric element according to the above aspect, b=1. According to the aspect, it is possible to cause the piezoelectric layer to be oriented in the (100) plane.

(7) In the piezoelectric element according to the above aspect, 2.8<z<3.2. According to the aspect, it is possible to cause the piezoelectric layer to be oriented in the (100) plane.

(8) In the piezoelectric element according to the above aspect, the thickness of the seed layer is equal to or more than 5 nm and equal to or less than 200 nm. According to the aspect, it is possible to cause the piezoelectric layer to be oriented in the (100) plane. Also, it is possible to achieve satisfactory dielectric characteristics of the piezoelectric layer.

(9) In the piezoelectric element according to the above aspect, the particle diameter of the piezoelectric layer on the seed layer is equal to or less than 2 m. According to the aspect, it is possible to curb cracking occurring in the piezoelectric layer.

(10) In the piezoelectric element according to the above aspect, when the piezoelectric layer is analyzed in the lamination direction by an X-ray diffraction method, a peak intensity in a (100) plane is higher than a peak intensity in a (110) plane in an X-ray diffraction pattern.

(11) In the piezoelectric element according to the above aspect, an uppermost layer of the first electrode is made of Pt, and the peak intensity in the (100) plane is higher than the peak intensity in the (110) plane of the piezoelectric element laminated on the Pt.

(12) In the piezoelectric element according to the above aspect, an uppermost layer of the substrate is made of $ZrO_2$, and the peak intensity in the (100) plane is higher than the peak intensity in the (110) plane of the piezoelectric element laminated on the $ZrO_2$.

(13) In the piezoelectric element according to the above aspect, a layer made of Ir is included between the first electrode and the piezoelectric element, and the peak intensity in the (100) plane is higher than the peak intensity in the (110) plane of the piezoelectric element laminated on the Ir.

(14) In the piezoelectric element according to the above aspect, the piezoelectric layer is a composite oxide containing at least Pb, Zi, and Ti and having a perovskite structure. According to the aspect, it is possible to improve piezoelectric characteristics of the piezoelectric layer oriented in the (100) plane.

(15) In the piezoelectric element according to the above aspect, the composite oxide of the seed layer has a perovskite structure.

(16) According to an aspect of the present disclosure, a liquid ejecting head is provided. The liquid ejecting head includes the piezoelectric element according to the above aspect and a drive circuit that drives the piezoelectric element. According to the aspect, it is possible to provide a liquid ejecting head including the piezoelectric element oriented in the (100) plane and having satisfactory piezoelectric characteristics.

(17) In the liquid ejecting head according to the above aspect, the piezoelectric element includes a plurality of active sections, the first electrode is individually provided for each of the plurality of active sections, and the second electrode is provided commonly to the plurality of active sections. According to the aspect, it is possible to provide a liquid ejecting head including a piezoelectric element having satisfactory piezoelectric characteristics, a first electrode, and a second electrode.

(18) In the liquid ejecting head according to the above aspect, the piezoelectric element includes a plurality of active sections, the first electrode is provided commonly to the plurality of active sections, and the second electrode is individually provided for each of the plurality of active sections. According to the aspect, it is possible to provide a liquid ejecting head including a piezoelectric element having satisfactory piezoelectric characteristics, a first electrode, and a second electrode.

(19) According to an aspect of the present disclosure, a liquid ejecting apparatus is provided. The liquid ejecting apparatus includes the liquid ejecting head according to the above aspect and a control section that controls operations of the liquid ejecting head. According to the aspect, it is possible to provide a liquid ejecting apparatus including a liquid ejecting head that includes a piezoelectric element having satisfactory piezoelectric characteristics, a first electrode, and a second electrode.

What is claimed is:

1. A piezoelectric element in which a first electrode, a seed layer, a piezoelectric layer, and a second electrode are laminated on a substrate, wherein the seed layer is a composite oxide containing at least Pb, Bi, Fe, and Ti, wherein the seed layer is a composite oxide containing at least Pb, Bi, Fe, and Ti, wherein the composite oxide included in the seed layer is represented by $Pb_xBi_{(a-x)}FeyTi_{(b-y)}O_z$, where, a>x and b>y, and wherein when the piezoelectric layer is analyzed from a lamination direction of the piezoelectric layer by an X-ray diffraction method, a peak intensity of a (100) plane is higher than a peak intensity of a (110) plane in an X-ray diffraction pattern.

2. The piezoelectric element according to claim 1, wherein 0.04<x/(a-x)<1.40.

3. The piezoelectric element according to claim 2, wherein x/(a-x)<0.72.

4. The piezoelectric element according to claim 1, wherein 0.8<(a/b)<1.4.

5. The piezoelectric element according to claim 1, wherein b=1.

6. The piezoelectric element according to claim 1, wherein $2.8<z<3.2$.

7. The piezoelectric element according to claim 1, wherein a thickness of the seed layer is equal to or more than 5 nm and equal to or less than 200 nm.

8. The piezoelectric element according to claim 1, wherein a particle diameter of the piezoelectric layer on the seed layer is equal to or less than 2 μm.

9. The piezoelectric element according to claim 1, wherein an uppermost layer of the first electrode is made of Pt, and the peak intensity of the (100) plane is higher than the peak intensity of the (110) plane in the piezoelectric element laminated on the Pt.

10. The piezoelectric element according to claim 1, wherein an uppermost layer of the substrate is made of $ZrO_2$, and the peak intensity of the (100) plane is higher than the peak intensity of the (110) plane in the piezoelectric element laminated on the $ZrO_2$.

11. The piezoelectric element according to claim 1, wherein a wiring made of Ir is included between the first electrode and the piezoelectric element, and the peak intensity of the (100) plane is higher than the peak intensity of the (110) plane in the piezoelectric element laminated on the Ir.

12. The piezoelectric element according to claim 1, wherein the piezoelectric layer is a composite oxide containing at least Pb, Zr, and Ti and having a perovskite structure.

13. The piezoelectric element according to claim 1, wherein the composite oxide of the seed layer has a perovskite structure.

14. A piezoelectric element in which a first electrode, a seed layer, a piezoelectric layer, and a second electrode are laminated on a substrate, wherein the seed layer is a composite oxide containing at least Pb, Bi, Fe, and Ti, wherein the composite oxide included in the seed layer is represented by $Pb_xBi_{(a-x)}Fe_yTi_{(b-y)}O_z$, where, $a>x$ and $b>y$, and wherein when the piezoelectric layer is analyzed from a lamination direction of the piezoelectric layer by an X-ray diffraction method, a half width of a rocking curve in a (100) plane in the X-ray diffraction method is equal to or less than 3.2°.

15. A liquid ejecting head comprising:
the piezoelectric element according to claim 1; and
a drive circuit that drives the piezoelectric element.

16. The liquid ejecting head according to claim 15, wherein
the piezoelectric element includes a plurality of active sections,
the first electrode is individually provided for each of the plurality of active sections, and
the second electrode is provided commonly to the plurality of active sections.

17. The liquid ejecting head according to claim 15, wherein
the piezoelectric element includes a plurality of active sections,
the first electrode is provided commonly to the plurality of active sections, and
the second electrode is provided individually for each of the plurality of active sections.

18. A liquid ejecting apparatus comprising:
the liquid ejecting head according to claim 15; and
a control section that controls an operation of the liquid ejecting head.

19. The piezoelectric element according to claim 1, wherein the composite oxide included in the seed layer does not have La.

20. The piezoelectric element according to claim 14, wherein $0.04<x/(a-x)<1.40$.

* * * * *